(12) United States Patent
Chen et al.

(10) Patent No.: US 8,253,041 B2
(45) Date of Patent: Aug. 28, 2012

(54) ELECTRONIC ELEMENT PACKAGING MODULE

(75) Inventors: Da-Jung Chen, Taoyuan County (TW); Chi-Feng Huang, Taipei (TW); Yi-Tsung Chen, Changhua County (TW); Huei-Ren You, Taichung (TW); Jeng-Jen Li, Taipei (TW)

(73) Assignee: Cyntec Co., Ltd., HsinChu (TW)

( * ) Notice: Subject to any disclaimer, the term of this patent is extended or adjusted under 35 U.S.C. 154(b) by 281 days.

(21) Appl. No.: 12/783,792

(22) Filed: May 20, 2010

(65) Prior Publication Data
US 2010/0309638 A1 Dec. 9, 2010

(30) Foreign Application Priority Data
Jun. 8, 2009 (TW) ................................ 98119053 A

(51) Int. Cl.
*H01L 23/495* (2006.01)
(52) U.S. Cl. ........ 174/536; 174/529; 174/563; 361/807; 361/813
(58) Field of Classification Search ................... 361/760, 361/772, 774, 813, 807; 174/50.5, 50.51, 174/50.54–50.56, 520, 521, 527–529, 535, 174/536, 539, 540, 545, 559–564, 262
See application file for complete search history.

(56) References Cited

U.S. PATENT DOCUMENTS

| 5,497,291 | A | 3/1996 | Hosen | 361/804 |
|---|---|---|---|---|
| 6,262,368 | B1* | 7/2001 | Riener et al. | 174/529 |
| 6,774,465 | B2 | 8/2004 | Lee et al. | 257/671 |
| 6,909,168 | B2* | 6/2005 | Minamio et al. | 257/670 |
| 2003/0096456 | A1* | 5/2003 | Yasunaga et al. | 438/124 |
| 2007/0196950 | A1* | 8/2007 | Shirai et al. | 438/106 |
| 2009/0016038 | A1* | 1/2009 | Shinoura et al. | 361/813 |
| 2009/0091013 | A1* | 4/2009 | Fukuda et al. | 257/676 |
| 2011/0278704 | A1* | 11/2011 | Chen et al. | 257/659 |

* cited by examiner

*Primary Examiner* — Hoa C Nguyen
(74) *Attorney, Agent, or Firm* — Lowe Hauptman Ham & Berner LLP

(57) ABSTRACT

An electronic element packaging module including a lead frame, an insulating layer and at least one electronic element is provided. The lead frame is a patterned metal sheet and has a first surface, a second surface opposite thereto and a through trench passing from the first surface to the second surface. A substrate portion and a plurality of lead portions around the substrate portion of the lead frame are defined by the through trench. The second surface of the lead frame is exposed outside the electronic element packaging module. The insulating layer disposed in the through trench has a third surface and a forth surface substantially coplanar with the first and the second surfaces, respectively. The electronic element disposed on the first surface is coupled to the lead frame.

25 Claims, 17 Drawing Sheets

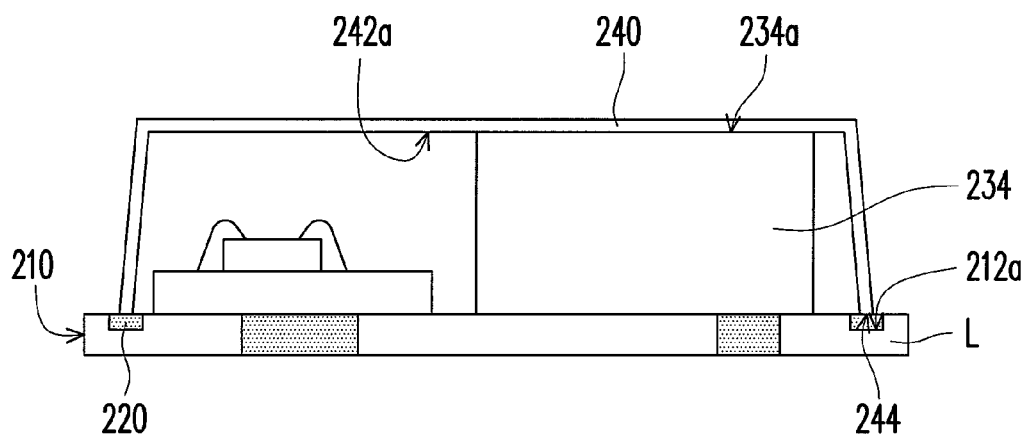
FIG. 5
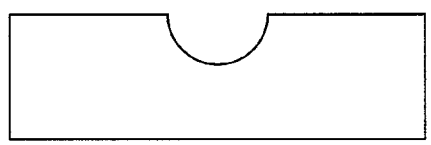 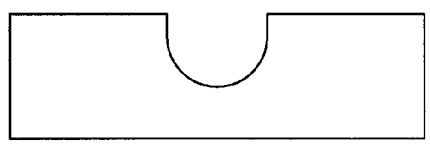
FIG. 6A          FIG. 6B

ELECTRONIC ELEMENT PACKAGING MODULE

CROSS-REFERENCE TO RELATED APPLICATION

This application claims the priority benefit of Taiwan application serial no. 98119053, filed on Jun. 8, 2009. The entirety of the above-mentioned patent application is hereby incorporated by reference herein and made a part of specification.

BACKGROUND OF THE INVENTION

1. Field of the Invention

The present invention relates to a packaging structure. More particularly, the present invention relates to an electronic element packaging module.

2. Description of Related Art

In the information age, electronic products are widely used in people's daily life, and along with continuous development of electronic technologies, the electronic products have design features of lightness, slimness, shortness and smallness. Therefore, high-density packaging techniques are correspondingly developed within the packaging domain, for example, a packing technique of system in a package. The system in a package refers to a system integration package structure, in which electronic elements are integrated into a single package structure including electronic elements such as passive devices, memories and electronic connectors, etc.

FIG. 1 is a cross-sectional view of a conventional system in package structure. Referring to FIG. 1, in the conventional system in package structure 100, a plurality of chips 110 are disposed on a wiring board 120, and the chips 110 are coupled to the wiring board 120 through a plurality of wires 140, and a package encapsulant 130 is used to encapsulate the chips 110. The system in package structure 100 has advantages of short electrical connecting wires among the chips 110 and small wiring configuration size, etc.

However, when the system in package structure 100 is exposed in the air, the package encapsulant 130 is liable to absorb vapor in the air, so that when the system in package structure 100 is welded to the other electronic elements, the package encapsulant 130 may have a popcorn effect due to the heat. Moreover, since the system in package structure 100 uses the package encapsulant 130 to encapsulate the chips 110, when the chips 110 are damaged or the wires 140 is open-circuited or short-circuited, the structure cannot be rework, and failure analysis of the elements is not easy to be performed. In addition, since the package encapsulant 130 and the wiring board 120 have a poor thermal conductivity property, the heat generated during the operation of the chips 110 is liable to be accumulated in the system in package structure 100, which may lead to operation errors or malfunctions of the chips 110.

SUMMARY OF THE INVENTION

The present invention is directed to an electronic element packaging module having a good heat-dissipation efficiency.

The present invention provides an electronic element packaging module including a lead frame, an insulating layer and at least one electronic element. The lead frame is a patterned metal sheet and has a first surface, a second surface opposite to the first surface and a through trench passing from the first surface to the second surface. A substrate portion and a plurality of lead portions surrounding the substrate portion of the lead frame are defined by the through trench. The second surface of the lead frame is exposed the electronic element packaging module. The insulating layer is disposed in the through trench and has a third surface substantially coplanar with the first surface and a forth surface substantially coplanar with the second surface. The electronic element is at least disposed on the first surface and is coupled to the lead frame.

In an embodiment of the present invention, a thermal conductivity coefficient of the insulating layer is greater than or equal to 0.75 W/(m·K).

In an embodiment of the present invention, the through trench divides the substrate portion into a plurality of sub substrate portions mutually separated from each other.

In an embodiment of the present invention, the sub substrate portions are respectively connected to at least a part of the lead portions.

In an embodiment of the present invention, a distance between the first surface and the second surface of the lead frame is substantially less than or equal to 0.5 mm.

In an embodiment of the present invention, the lead frame is a single layer structure.

In an embodiment of the present invention, the lead frame has a plurality of grooves, wherein the grooves are connected to the through trench, and the insulating layer is filled in the grooves.

In an embodiment of the present invention, the grooves are formed on the first surface or the second surface of the lead frame.

In an embodiment of the present invention, a profile of a cross section of the groove is a U-shape, a semicircle, a V-shape, a square, a trapezoid, a mushroom-shape, a ladder-shape, a dovetail notch shape or an irregular shape.

In an embodiment of the present invention, the grooves are respectively located at end parts of the lead portions.

In an embodiment of the present invention, the lead frame has a plurality of sidewalls passing from the first surface to the second surface, and the grooves are formed on the sidewalls.

In an embodiment of the present invention, the grooves do not connect the first surface and the second surface.

In an embodiment of the present invention, the grooves connect the first surface and the second surface.

In an embodiment of the present invention, the electronic element packaging module further includes a cap having a containing concave, the cap is dispose on the first surface, and the lead frame and the insulating layer seals the containing concave to form a containing space, wherein the electronic element is disposed in the containing space.

In an embodiment of the present invention, a material of the cap includes metal, resin, gum, plastic or ceramic.

In an embodiment of the present invention, a material of the cap is a conductive material, and the electronic element packaging module further includes an insulating frame disposed between the lead frame and an edge of the cap.

In an embodiment of the present invention, the lead frame has a plurality of grooves and a material of the cap is a conductive material, wherein the grooves are formed on edges of the lead portions adjacent to the cap, and the insulating layer is filled in the grooves and is located between the edge of the cap and the lead frame.

In an embodiment of the present invention, the electronic element packaging module further includes a frame connected between the lead frame and an edge of the cap, wherein an ultrasonic welding interface is formed between the frame and the edge of the cap.

In an embodiment of the present invention, the electronic element packaging module further includes an adhesion layer connected between the lead frame and an edge of the cap.

In an embodiment of the present invention, the electronic element packaging module further includes at least one buckle bar disposed outside the containing space, wherein the buckle bar has two end portions and a center portion connecting the two end portions, the two end portions are fixed on the insulating layer, and the center portion extends towards a top surface of the cap apart from the lead frame, and leans against the top surface.

In an embodiment of the present invention, the electronic element packaging module further includes a bonding structure having a pillar and a stop portion, wherein the pillar has a first end and a second end opposite to the first end, the first end is connected to the cap, the second end penetrates through the insulating layer and is connected to the stop portion, and the stop portion leans against the fourth surface of the insulating layer.

In an embodiment of the present invention, the electronic element packaging module further includes an engagement frame disposed on the insulating layer, and the engagement frame is interfered with and fitted in the edge of the cap.

In an embodiment of the present invention, the electronic element packaging module further includes a flexible plastic material filled in the containing space.

In an embodiment of the present invention, a material of the cap is a metal material, and a surface of the electronic element directly contacts an inner surface of the cap.

In an embodiment of the present invention, each of the lead portions has an external end protruding out the insulating layer.

In the present invention, the cap is used to replace the conventional package encapsulant, so that the problem of the conventional technique that the package encapsulant is liable to absorb the vapor can be avoided. Moreover, since the lead frame is used as a substrate for carrying the electronic elements, the heat generated during the operation of the electronic elements can be quickly conducted to external through the lead frame.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a cross-sectional view of an electronic element packaging module having a lead frame of FIG. 4A according to an embodiment of the present invention.

FIG. 6A-FIG. 6I are schematic diagrams illustrating profiles of cross sections of grooves of a lead frame according to an embodiment of the present invention.

DESCRIPTION OF THE EMBODIMENTS

Figure 1:
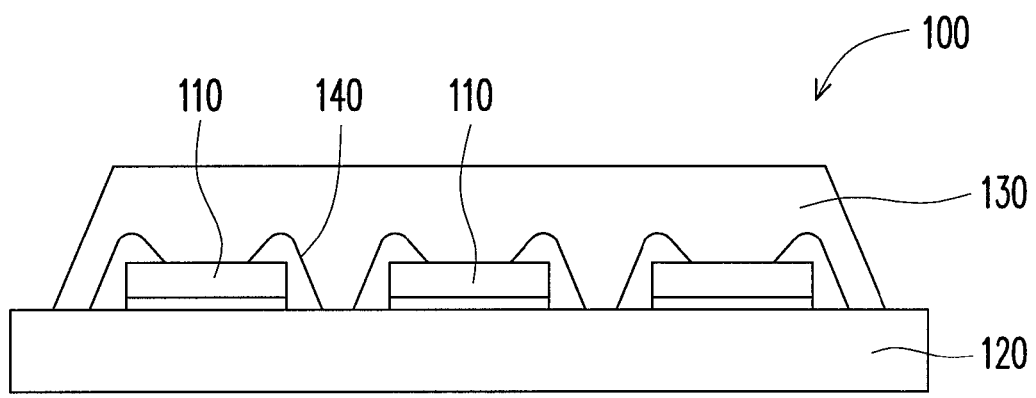
FIG. 1 is a cross-sectional view of a conventional system in package structure.
Figure 2A:
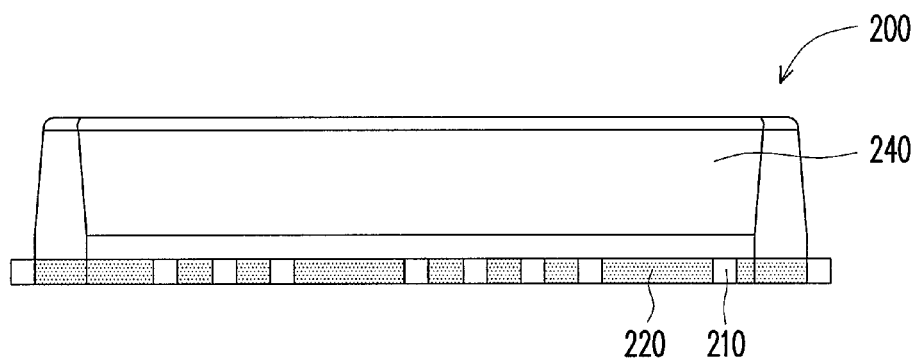
FIG. 2A, FIG. 2B and FIG. 2C are respectively a schematic diagram, a cross-sectional view and an exploded view of an electronic element packaging module according to an embodiment of the present invention.
Figure 2B:
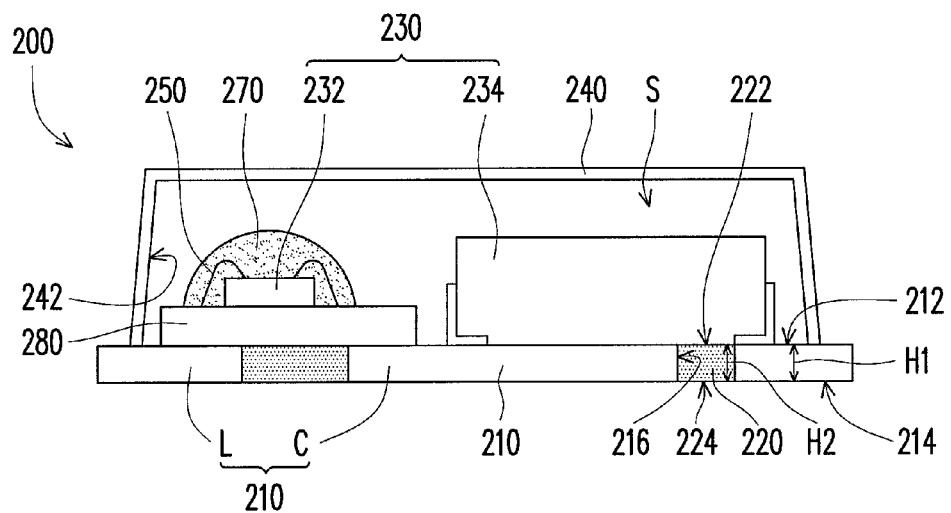
Figure 2C:
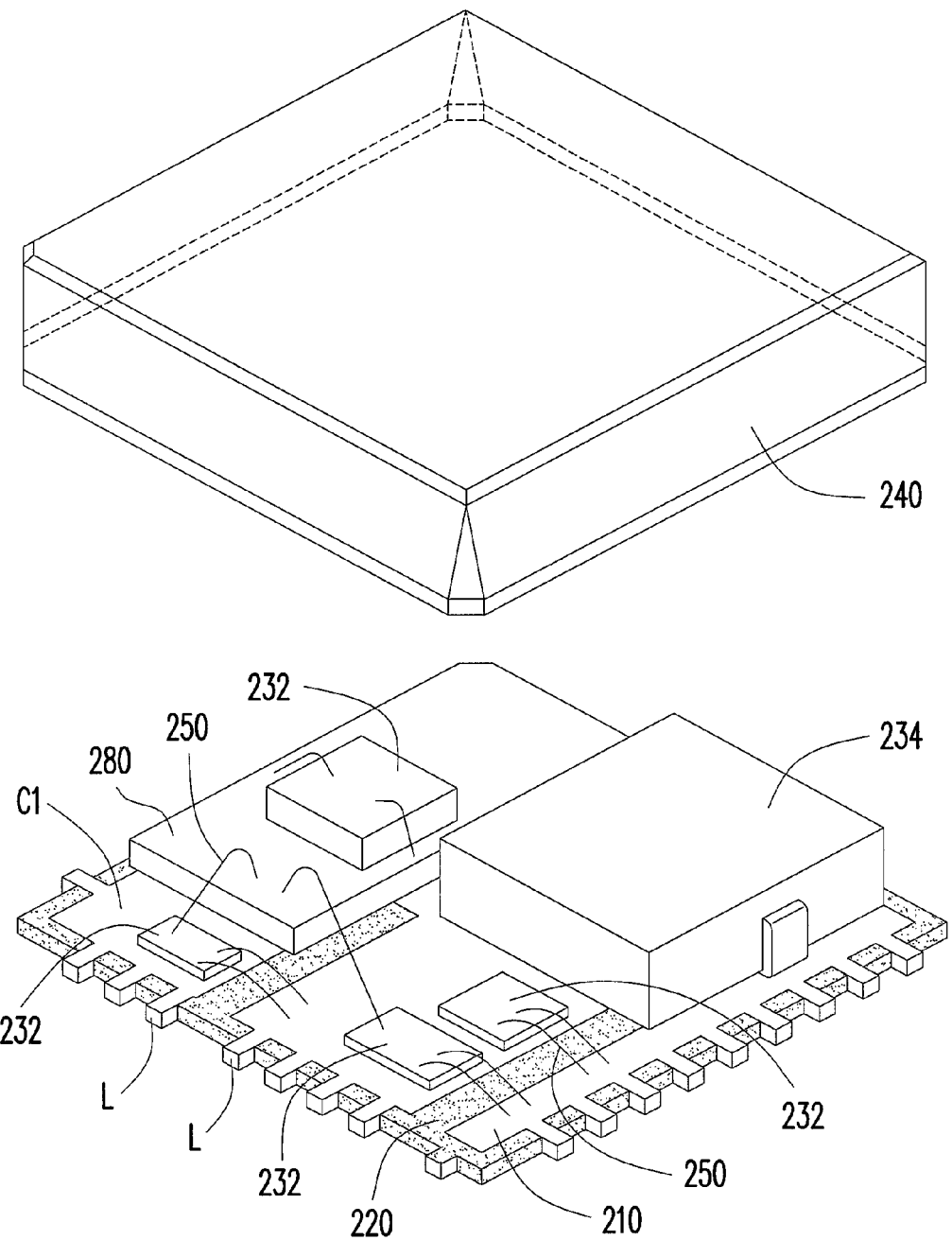
Figure 2D:
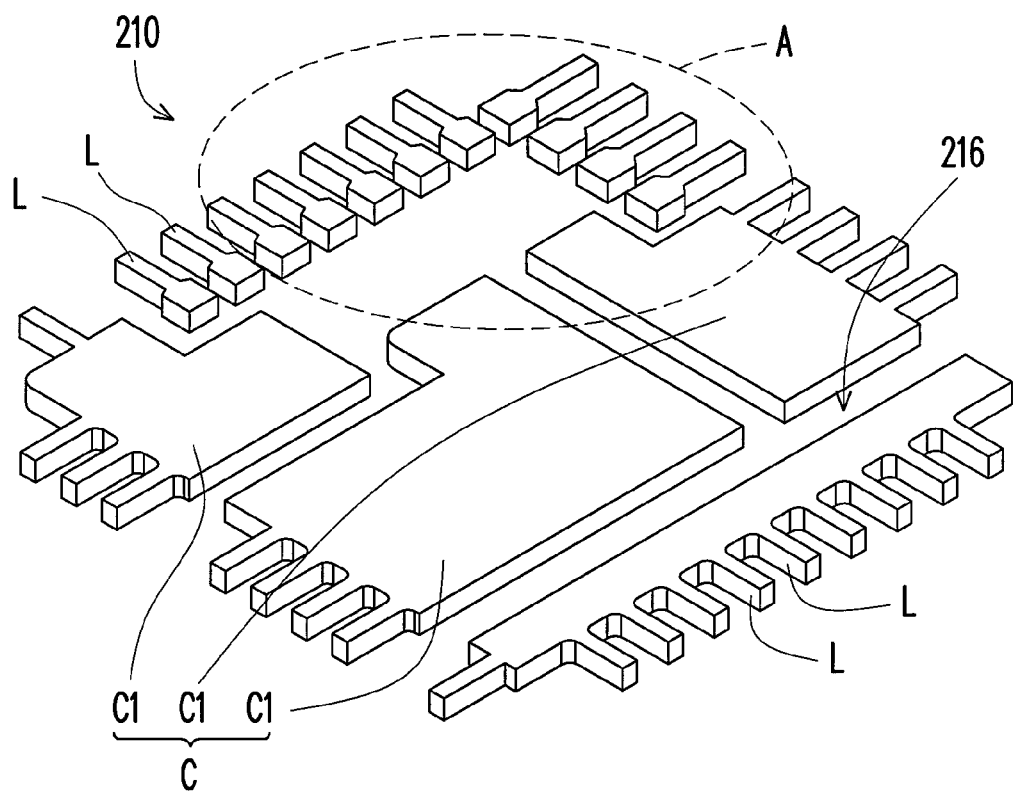
FIG. 2D is a schematic diagram of a lead frame of FIG. 2A.
Figure 3A:
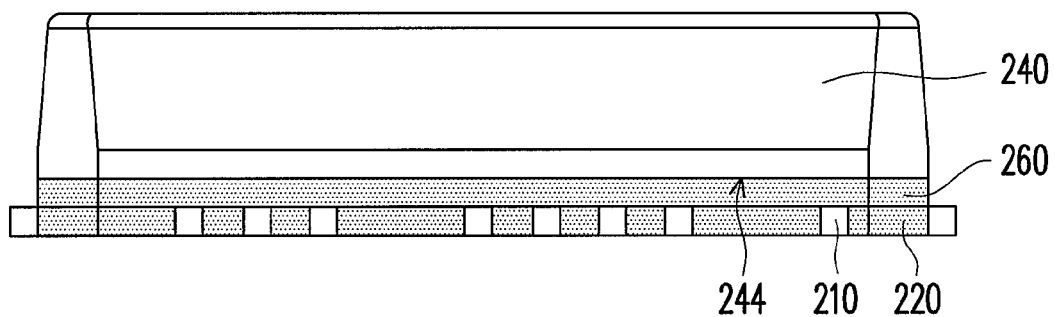
FIG. 3A is a diagram illustrating a variation of an electronic element packaging module of FIG. 2A.
Figure 3B:
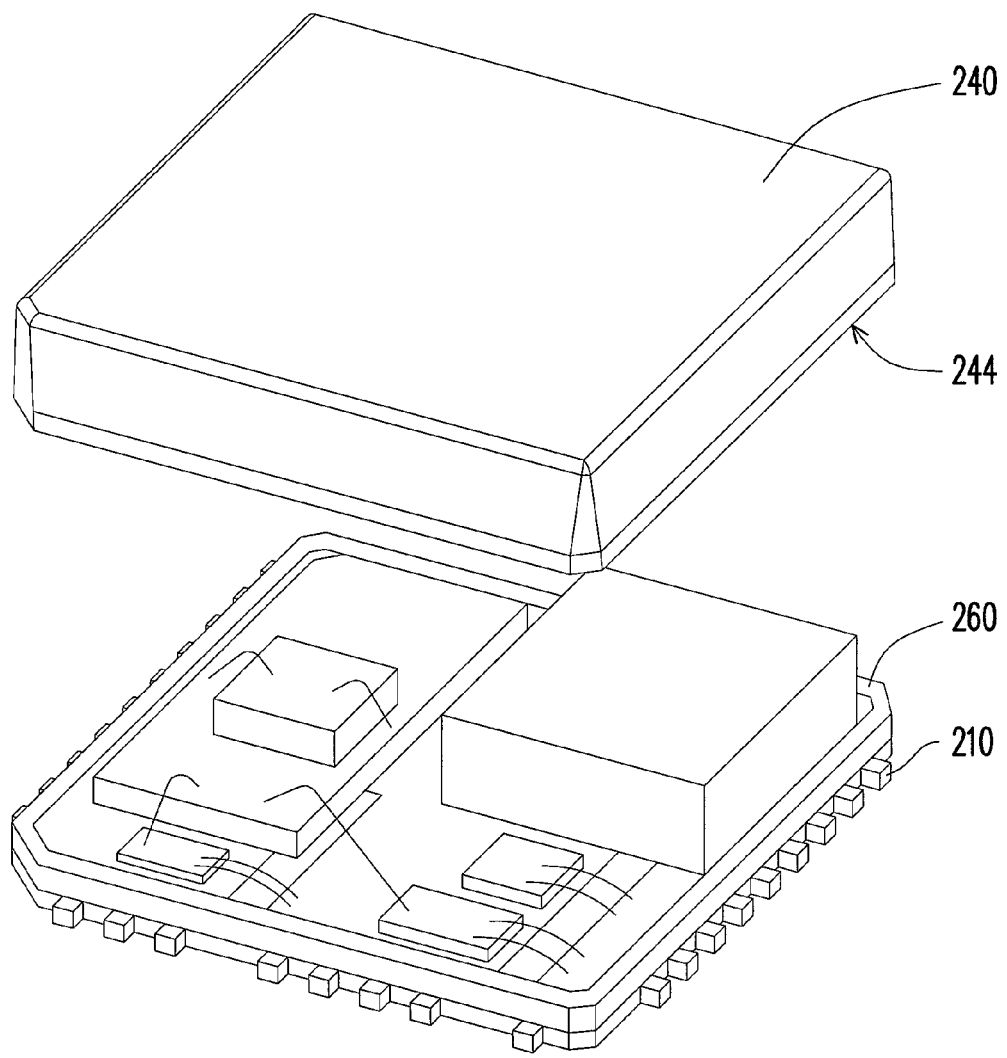
FIG. 3B is an exploded view of an electronic element packaging module of FIG. 3A.

FIG. 2A, FIG. 2B and FIG. 2C are respectively a schematic diagram, a cross-sectional view and an exploded view of an electronic element packaging module according to an embodiment of the present invention, and FIG. 2D is a schematic diagram of a lead frame of FIG. 2A. FIG. 3A is a diagram illustrating a variation of the electronic element packaging module of FIG. 2A, and FIG. 3B is an exploded view of the electronic element packaging module of FIG. 3A.

Referring to FIG. 2A, FIG. 2B and FIG. 2C, the electronic element packaging module 200 of the present embodiment includes a lead frame 210, an insulating layer 220, at least one electronic element 230 and a cap 240. The lead frame 210 is a patterned metal sheet and has a first surface 212, a second surface 214 opposite to the first surface 212, and a through trench 216 passing from the first surface 212 to the second surface 214. In the present embodiment, a distance H1 between the first surface 212 and the second surface 214 of the lead frame 210 is substantially less than or equal to 0.5 mm. In other words, a thickness of the lead frame 210 is substantially less than or equal to 0.5 mm. In the present embodiment, the second surface 214 of the lead frame 210 is exposed the electronic element packaging module 200. The lead frame 210 is a single layer structure, and a material thereof is, for example, copper.

Referring to FIG. 2D, a substrate portion C and a plurality of lead portions L around the substrate portion C of the lead frame 210 are defined by the through trench 216. In detail, the through trench 216 can also divide the substrate portion C into a plurality of sub substrate portions C1 mutually separated from each other, and the sub substrate portions C1 are respectively connected to a part of the lead portions L, and the other lead portions L are separated from the substrate portion C.

Referring to FIG. 2A, FIG. 2B and FIG. 2C, the insulating layer 220 is disposed in the through trench 216 and has a third surface 222 and a fourth surface 224, wherein the third surface 222 is substantially coplanar with the first surface 212, and the forth surface 224 is substantially coplanar with the second surface 214. According to the above descriptions, it is known that a distance H2 between the third surface 222 and the fourth surface 224 of the insulating layer 220 (i.e. a thickness of the insulating layer 220) is substantially less than or equal to 0.5 mm. A thermal conductivity coefficient of the insulating layer 220 is greater than or equal to 0.75 W/(m·K), and a material of the insulating layer 220 is, for example, resin or other insulating materials with high thermal conductivity coefficient. It should be noticed that each of the lead portions L of the lead frame has an external end protruding out the insulating layer 220, which is used for electrically connecting a next stage electronic apparatus (for example, a mother board).

Referring to FIG. 2B and FIG. 2C, the electronic element 230 is disposed on the first surface 212 and is coupled to the lead frame 210. In detail, the electronic element 230 can be directly disposed on the first surface 212 or can be disposed on the first surface 212 through a carrier 280 (for example, a printed circuit board or a ceramic substrate). Moreover, the electronic element 230 can be only disposed on the substrate portion C, or can be simultaneously disposed on the substrate portion C and the insulating layer 220, or can be simultaneously disposed on the substrate portion C, the lead portion L and the insulating layer 220. The electronic element 230 can be an active device (for example, a semiconductor device 232) or a passive device (for example, a choke 234), and can be a die, a chip or a plug-in, which can be coupled to the lead frame 210 through techniques such as, flip chip bonding, wire bonding or surface mounting, etc. If the electronic device 230 is the semiconductor device 232 (for example, a pulse width modulation control chip), it can be coupled to the lead portions L of the lead frame 210 through a plurality of wires 250. A material of the wire 250 is, for example, gold, copper or aluminum, and a package encapsulant 270 can be used to encapsulate the semiconductor device 232 and the wire 250. If the electronic element 230 is the choke 234, it can be coupled to the lead frame 210 through the surface mounting technique. It should be noticed that in the present embodiment, the electronic elements 230 (such as the choke 234 or a high power chip, etc.) that may generate more heat during the operation can be directly disposed on the lead frame 210, so as to directly dissipate the heat through the lead frame 210 to achieve a good heat-dissipation efficiency.

Referring to FIG. 2B, the cap 240 has a containing concave 242, the cap 240 is dispose on the first surface 212 of the lead frame 210, and the lead frame 210 and the insulating layer 220 seals the containing concave 242 to form a containing space S, wherein the electronic element 230 is disposed in the containing space S. A material of the cap 240 is, for example, metal, resin, gum, plastic, ceramic or other materials with a high thermal conductivity coefficient. Moreover, to protect the electronic element 230 in the containing space S, a flexible plastic material (not shown) can be selectively filled in the containing space S.

It should be noticed that since the cap 240 is used in the present embodiment to replace the conventional package encapsulant, the problem of the conventional technique that the package encapsulant is liable to absorb the vapor can be avoided. Moreover, since the cap 240 of the present embodiment can be independently disassembled and reinstalled, the electronic element packaging module 200 of the present embodiment is easy to be reworked, and a failure analysis of the elements is easy to be performed. In addition, since the lead frame 210 is used as a substrate for carrying the electronic element 230, and the second surface 214 of the lead frame 210 is exposed outside the electronic element packaging module 200, the heat generated during the operation of the electronic element 230 can be quickly conducted to external through the lead frame 210. Further, in the present embodiment, the material of the cap 240 can be a metal material, so that an outer structure of the electronic element packaging module 200 is almost composed of metal (the lead frame 230 and the cap 240) with an excellent thermal conductivity. Therefore, a thermal conduction effect of the packaging module is improved, and the cap 240 composed of metal can provide an electromagnetic wave shielding effect.

Moreover, since the insulating layer 220 applies a material with a thermal conductivity coefficient being greater than or equal to 0.75 W/(m·K), the heat generated by the electronic element 230 on the sub substrate portion C1 can be quickly dispersed to the other sub substrate portions C1 and the lead portions L through the insulating layer 220, so as to uniform a thermal distribution of the whole electronic element packaging module 200, and improve the heat dissipation efficiency.

Referring to FIG. 3A and FIG. 3B, if the material of the cap 240 is a conductive material, an insulating frame 260 can be configured between the lead frame 210 and an edge 244 of the cap 240, so as to electrically insulate the lead frame 210 and the cap 240. The insulating frame 260 and the insulating layer 220 are, for example, formed integrally. It should be noticed that the edge 244 of the cap 240 refers to the edge of the cap 240 that is located adjacent to the lead frame 210 (i.e. the lower edge of the cap 240). Moreover, if the material of the cap 240 is the metal material, a surface 234a of the electronic element 230 (such as the choke 234) that may generate more heat during the operation can directly contact an inner surface 242a (shown in FIG. 5) of the cap 240, so that the cap 240 may serve as a radiator of the choke 234, so as to quickly conduct the heat of the choke 234 to the external through the cap 240.

FIGS. 4A-4J are partial schematic diagrams illustrating a plurality of variation structures of the lead frame of FIG. 2D. It should be noticed a region A of the lead frame 210 of FIG. 2D is illustrated in FIGS. 4A-4J. Moreover, the insulating layer mentioned in the embodiments of FIGS. 4A-4J is the insulating layer 220 of FIGS. 2A-2C. In the present embodiment, the lead frame 210 further has a plurality of grooves (for example, the grooves 212a, 214a, and 216b-216f in FIGS. 4A-4J). The grooves are connected to the through trench 216, and the insulating layer (not shown) is filled in the grooves. The grooves can be formed on at least one surface (for example, the first surface 212, the second surface 214, or the sidewall 216a passing from the first surface 212 to the second surface 214) of the lead frame 210, and can divide the surface of the lead frame 210 into a concave portion and a protrusion portion. In case that the electrical property of the lead frame 210 is not influenced, the grooves can be selectively formed on the substrate portion C or the lead portions L of the lead frame 210. Since the grooves are connected to the through trench 216, the part of the insulating layer located in the through trench 216 can be directly connected to the part of the insulating layer located in the grooves. Therefore, a contact area between the lead frame 210 and the insulating layer can be increased by the grooves, so as to increase a bonding force between the lead frame 210 and the insulating layer. Moreover, a fixing effect that the insulating layer fixes the lead portions L can be strengthened by forming the grooves on the lead portions L. A plurality of designs is provided below to describe configuration positions of the grooves, though the following designs are only used as examples, which are not used for limiting the present invention.

Figure 4A:
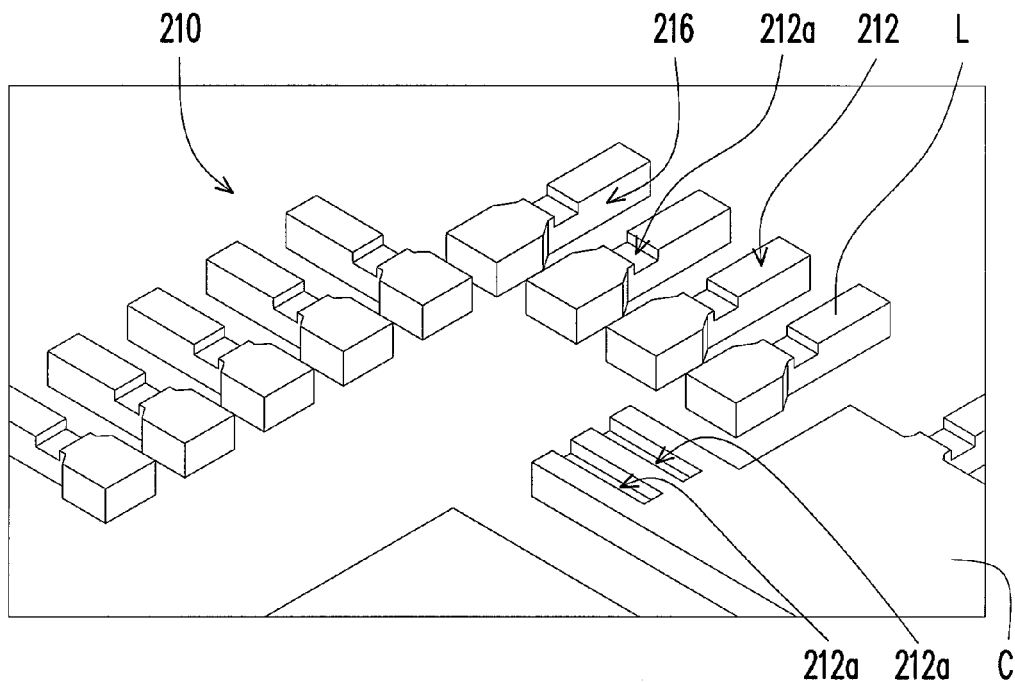
FIGS. 4A-4J are partial schematic diagrams illustrating a plurality of variation structures of a lead frame of FIG. 2D.

Referring to FIG. 4A, the grooves 212a are formed on the first surface 212 of the lead frame 210 without penetrating through the lead frame 210, wherein the grooves 212a can be selectively formed on the substrate portion C or the lead portions L of the lead frame 210. If the material of the cap 240 is the conductive material, a plurality of the grooves 212a can be formed on the lead portions L located adjacent to the edge 244 of the cap 240 (as shown in FIG. 5), and the insulating layer 220 can be filled in the grooves 212a. Therefore, the insulating layer 220 is located between the edge 244 of the cap 240 and the lead frame 210, so as to electrically insulate the cap 240 and the lead frame 210.

Figure 4B:
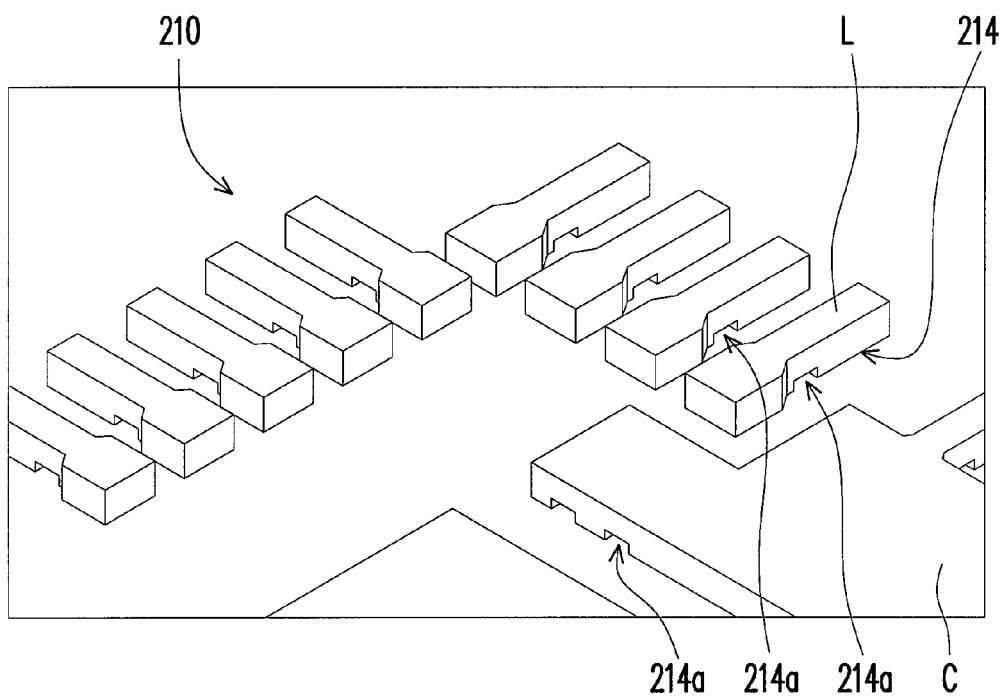
Figure 4C:
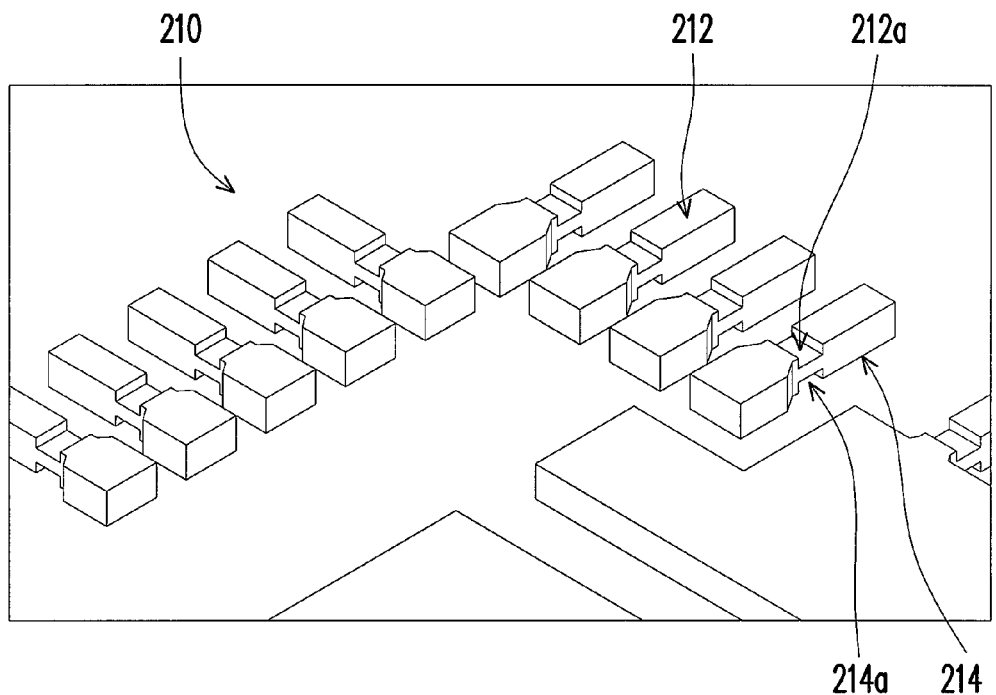

Referring to FIG. 4B, the grooves 214a are formed on the second surface 214 of the lead frame 210 without penetrating through the lead frame 210, wherein the grooves 214a can be selectively formed on the substrate portion C or the lead portions L of the lead frame 210. Referring to FIG. 4C, the embodiment of FIG. 4C is a combination of the embodiments of FIG. 4B and FIG. 4A, in which a plurality of grooves 212a and a plurality of grooves 214a are respectively formed on the first surface 212 and the second surface 214.

Figure 4D:
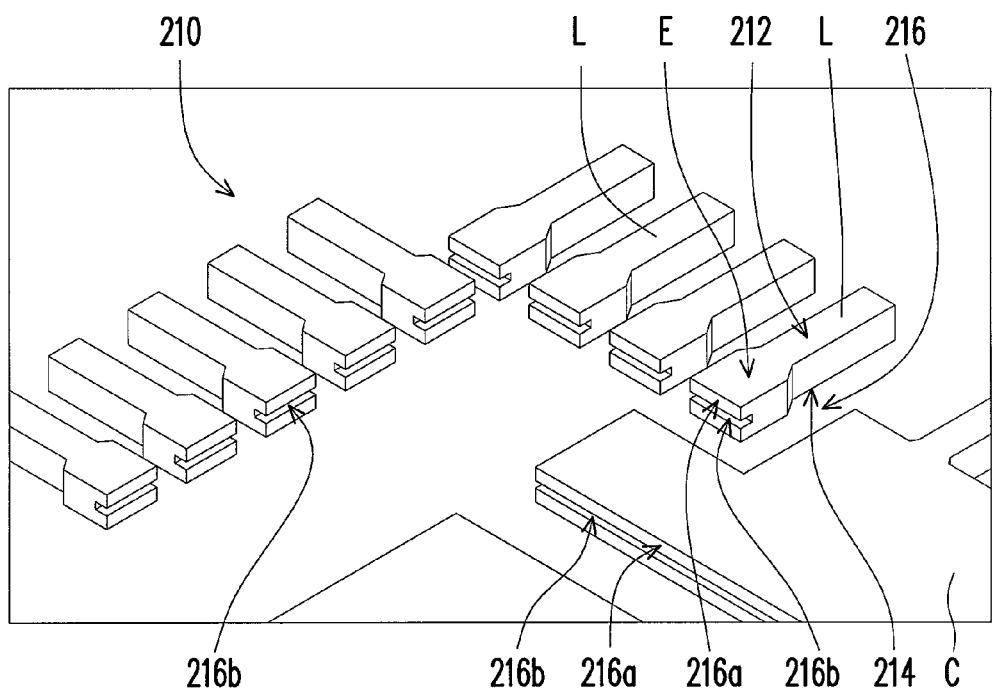

Referring to FIG. 4D, the grooves 216b are formed on the sidewalls 216a of the lead frame 210 without passing from the first surface 212 to the second surface 214, wherein the grooves 216b can be selectively formed on the substrate portion C or the lead portions L of the lead frame 210. In the present embodiment, a part of the grooves 216b are formed on the sidewalls 216a of end parts E (i.e. surfaces of the lead portions L that face the substrate portion C) of the lead portions L, and a part of the grooves 216b are formed on the sidewalls 216a of the substrate portion C.

Figure 4E:
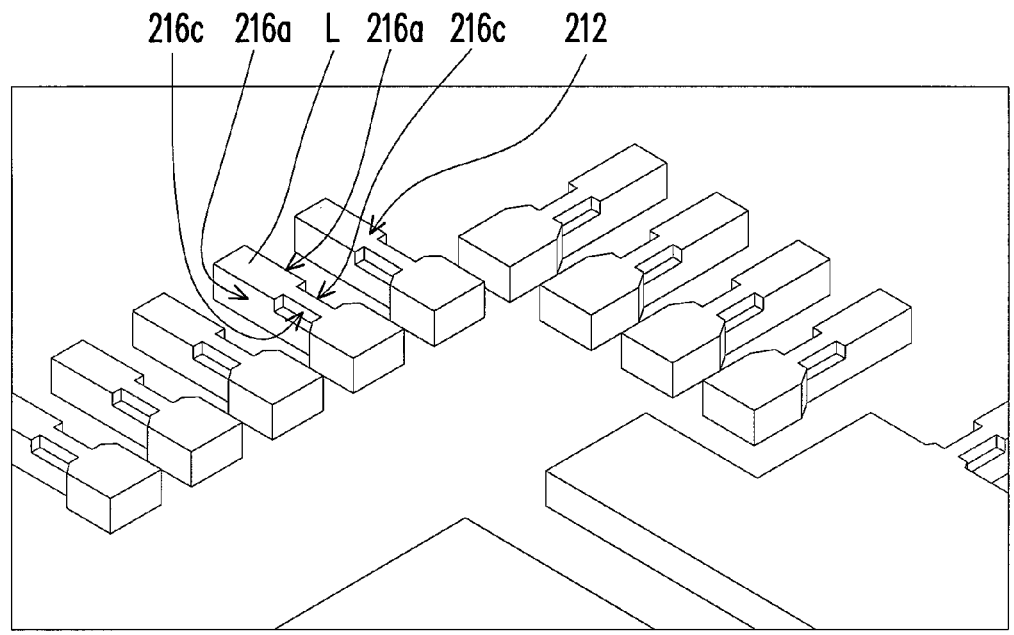
Figure 4F:
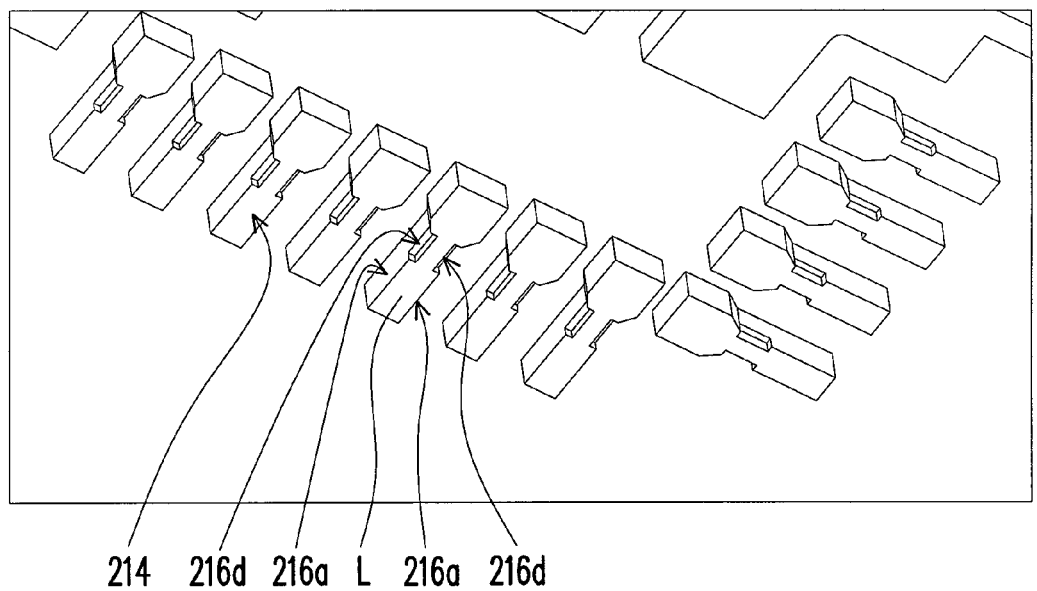
Figure 4G:
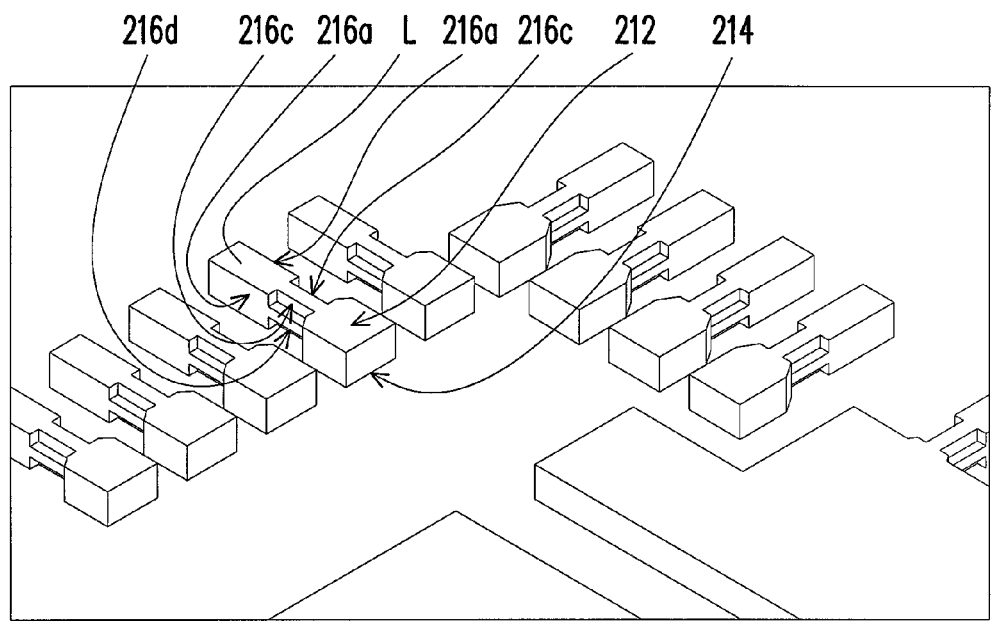

In FIG. 4E, two grooves 216c are respectively formed on two opposite sidewalls 216a of a lead portion L, and the grooves 216c are all connected to the first surface 212. In FIG. 4F, two grooves 216d are respectively formed on two opposite sidewalls 216a of each of the lead portions L, and the grooves 216d are all connected to the second surface 214. Referring to FIG. 4G, the embodiment of FIG. 4G is a combination of the embodiments of FIG. 4E and FIG. 4F, in which the grooves 216c are respectively formed on two opposite sidewalls 216a of each of the lead portions L, and the grooves 216c are all connected to the first surface 212. Moreover, two grooves 216d are respectively formed on two opposite sidewalls 216a of each of the lead portions L, and the grooves 216d are all connected to the second surface 214.

Figure 4H:
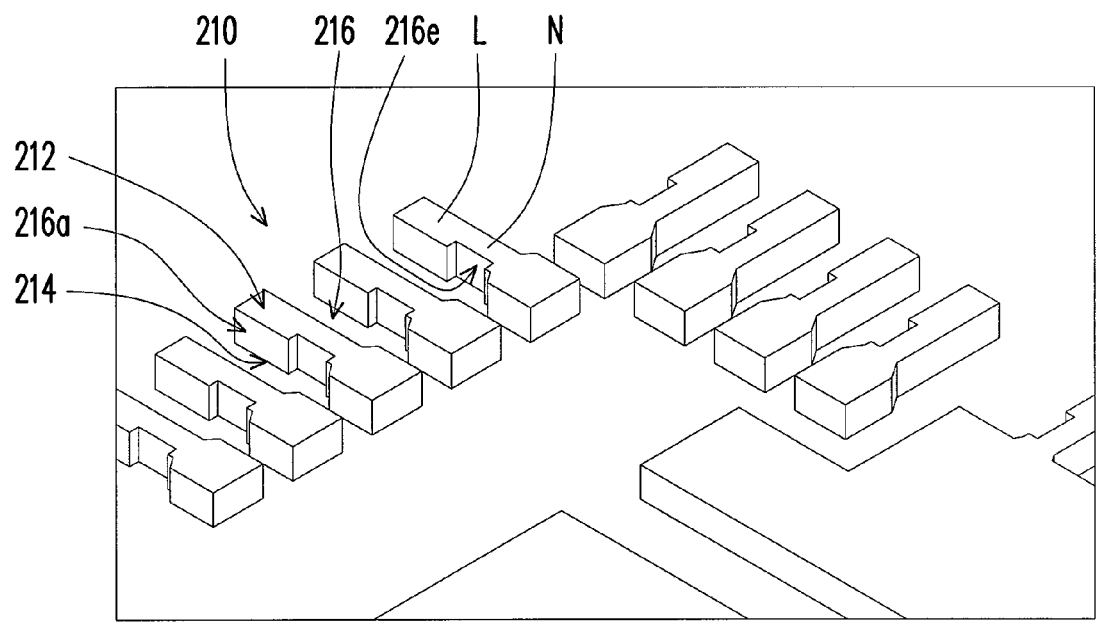
Figure 4I:
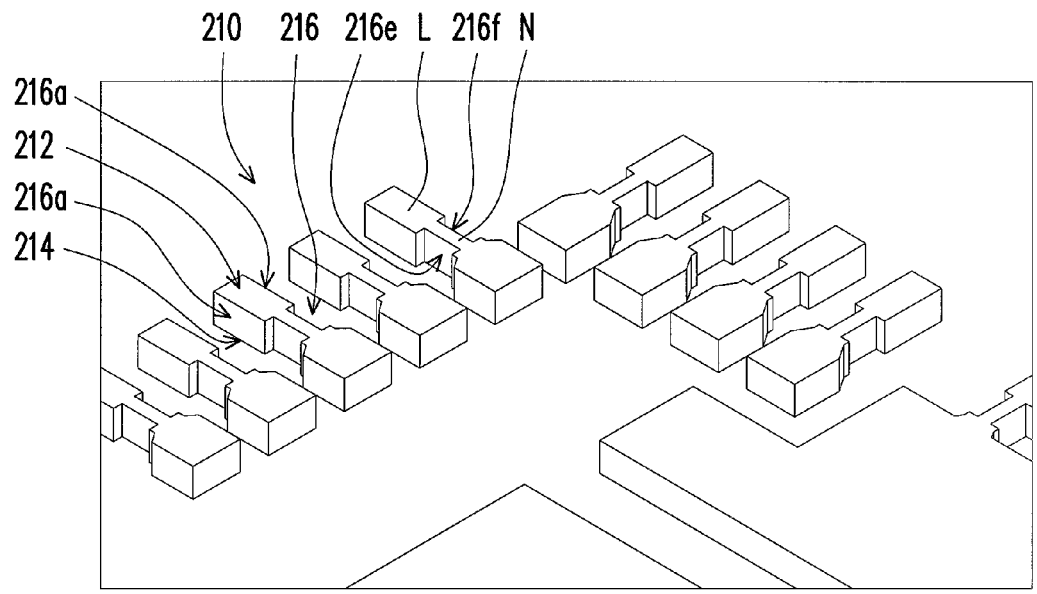

Referring to FIG. 4H, the groove 216e is formed on a single sidewall 216a of each of the lead portions L of the lead frame 210, and the groove 216e simultaneously connects the first surface 212 and the second surface 214, so that a neck retraction portion N is formed aside the groove 216e. Referring to FIG. 4I, the groove 216e and the groove 216f are respectively formed on two opposite sidewalls 216a of each of the lead portions L of the lead frame 210. The grooves 216e and 216f simultaneously connect the first surface 212 and the second surface 214, so that a neck retraction portion N is formed between the grooves 216e and 216f.

Figure 4J:
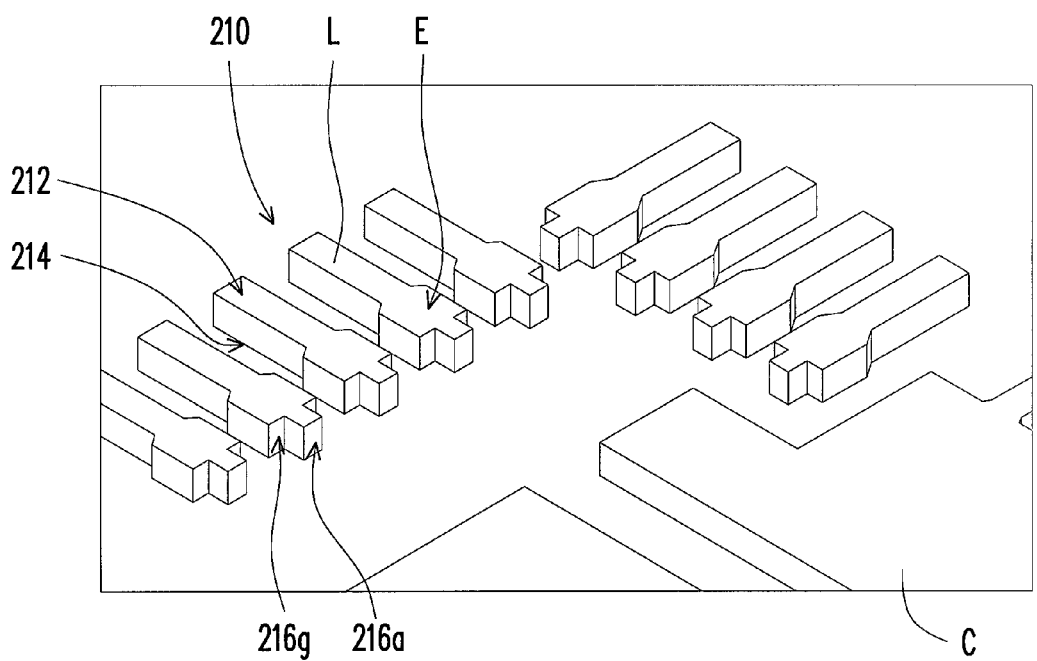
Figure 6C:
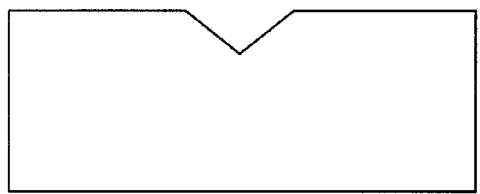
Figure 6D:
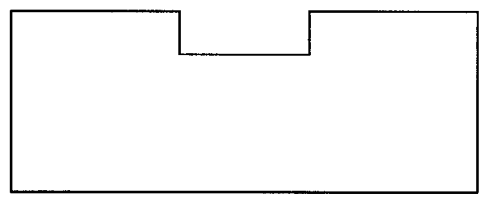
Figure 6E:
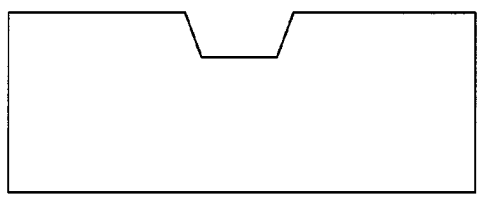
Figure 6F:
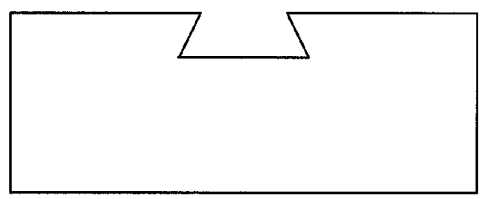
Figure 6G:
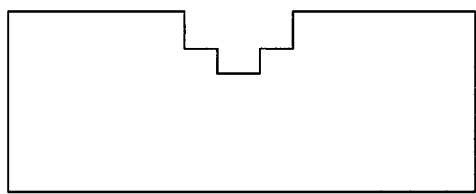
Figure 6H:
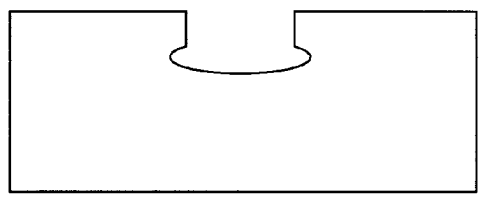
Figure 6I:
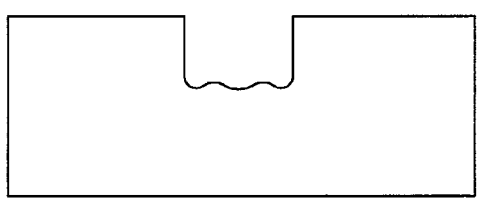

Referring to FIG. 4J, the grooves 216g are formed on the sidewalls 216a of the lead frame 210, and the grooves 216g connect the first surface 212 and the second surface 214. In the present embodiment, the grooves 216g are located on the sidewall 216a of the end part E (i.e. the surface of the lead portion L that faces the substrate portion C) of each of the lead portions L.

FIG. 6A-FIG. 6I are schematic diagrams illustrating profiles of cross sections of the grooves of the lead frame according to an embodiment of the present invention. Moreover, in the embodiments of FIGS. 4A-4J, the profile of the cross section of each of the grooves is, for example, a semicircle (shown in FIG. 6A), a U-shape (shown in FIG. 6B), a V-shape (shown in FIG. 6C), a square (shown in FIG. 6D), a trapezoid (shown in FIG. 6E), a dovetail notch shape (shown in FIG. 6F), a ladder-shape (shown in FIG. 6G), a mushroom-shape (shown in FIG. 6H), or an irregular shape (shown in FIG. 6I).

A plurality of methods for fixing the cap 240 of FIG. 2A to the lead frame 210 is described below, and the methods described below are only examples, which are not used for limiting the present invention.

Figure 7:
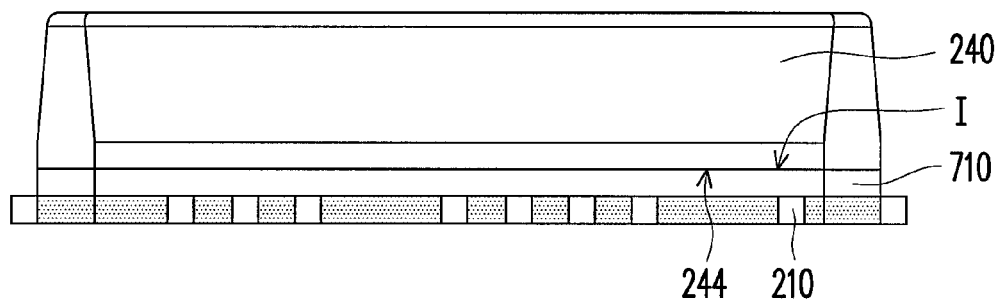
FIG. 7 is a schematic diagram of an electronic element packaging module according to an embodiment of the present invention.

FIG. 7 is a schematic diagram of an electronic element packaging module according to an embodiment of the present invention. Referring to FIG. 7, if the material of the cap 240 is resin, gum or plastic, a frame 710 can be configured between the lead frame 210 and the edge 244 of the cap 240, and a material of the frame 710 can be resin, gum or plastic. Then, an ultrasonic welding is performed to the frame 710 and the edge 244 of the cap 240 to form an ultrasonic welding interface I between the frame 710 and the edge 244 of the cap 240.

Figure 8:
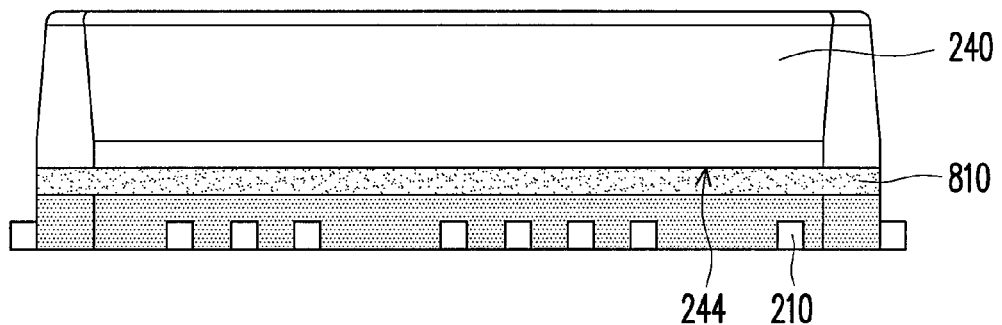
FIG. 8 is a schematic diagram of an electronic element packaging module according to an embodiment of the present invention.

FIG. 8 is a schematic diagram of an electronic element packaging module according to an embodiment of the present invention. Referring to FIG. 8, an adhesion layer 810 can be configured between the lead frame 210 and the edge 244 of the cap 240.

Figure 9A:
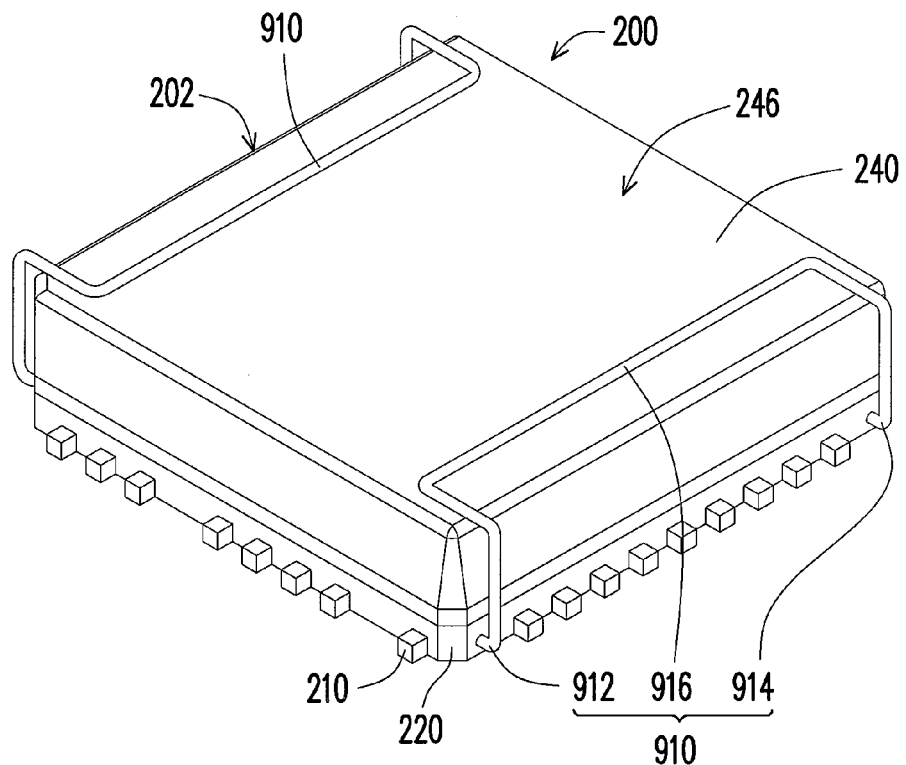
FIG. 9A is a schematic diagram of an electronic element packaging module according to an embodiment of the present invention.
Figure 9B:
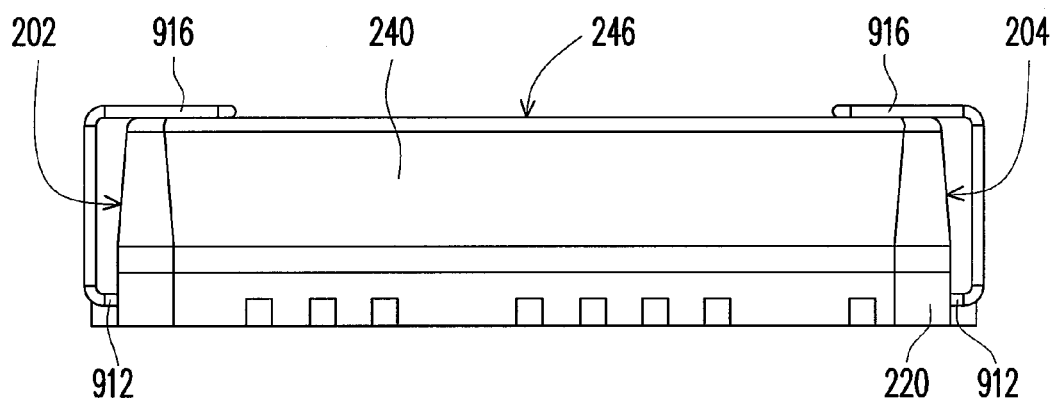
FIG. 9B is a side view of an electronic element packaging module of FIG. 9A.

FIG. 9A is a schematic diagram of an electronic element packaging module according to an embodiment of the present invention. FIG. 9B is a side view of the electronic element packaging module of FIG. 9A. Referring to FIG. 9A and FIG. 9B, two buckle bars 910 can be configured outside the containing space of the electronic element packaging module 200. Each of the buckle bars 910 has two end portions 912 and 914 and a center portion 916 connecting the two end portions 912 and 914, wherein the two end portions 912 and 914 are fixed on the insulating layer 220, and the center portion 916 extends towards a top surface 246 of the cap 240 facing away from the lead frame 210, and leans against the top surface 246. In the present embodiment, the two buckle bars 910 are respectively disposed on two opposite side surfaces 202 and 204 of the electronic element packaging module 200.

Figure 10A:
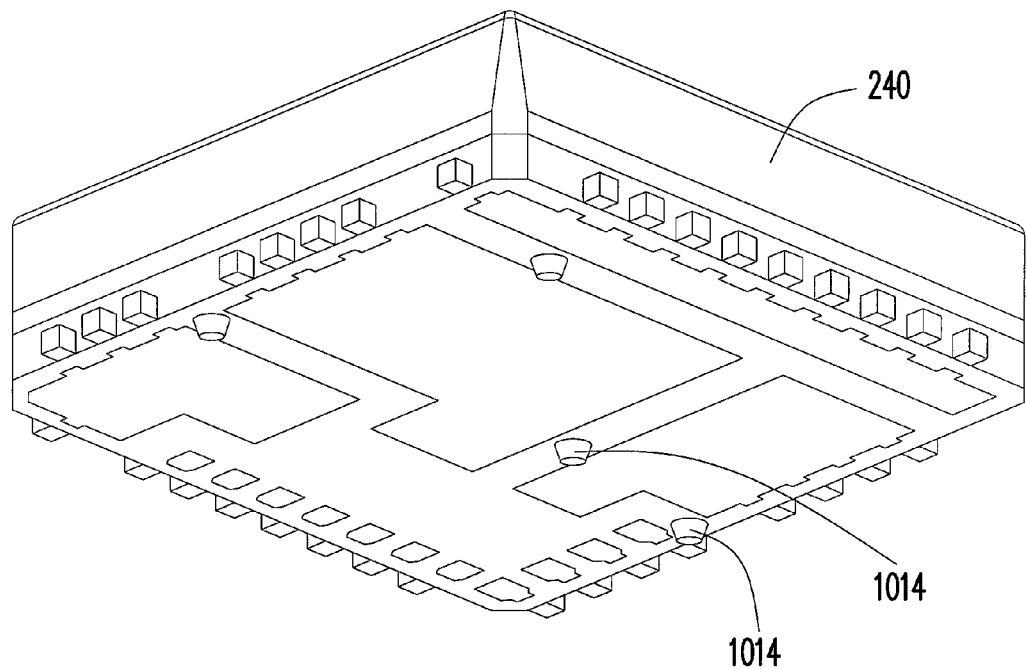
FIG. 10A is a schematic diagram of an electronic element packaging module according to an embodiment of the present invention.
Figure 10B:
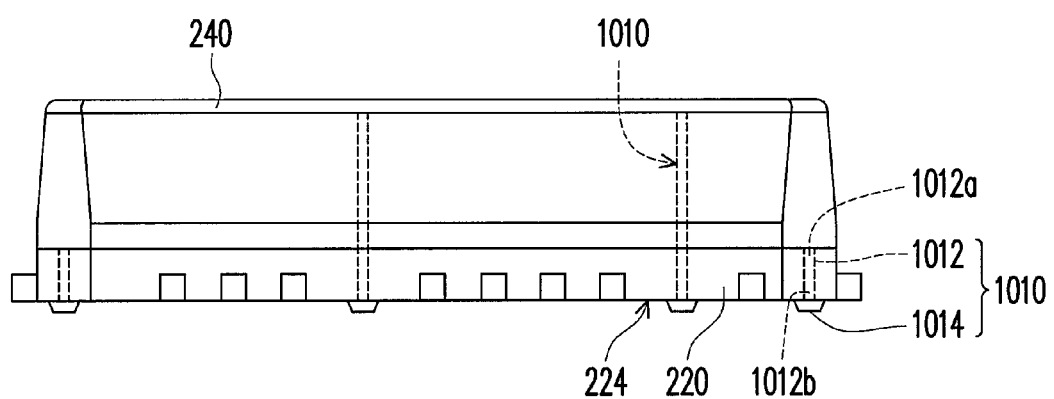
FIG. 10B is a side view of an electronic element packaging module of FIG. 10A.
Figure 11A:
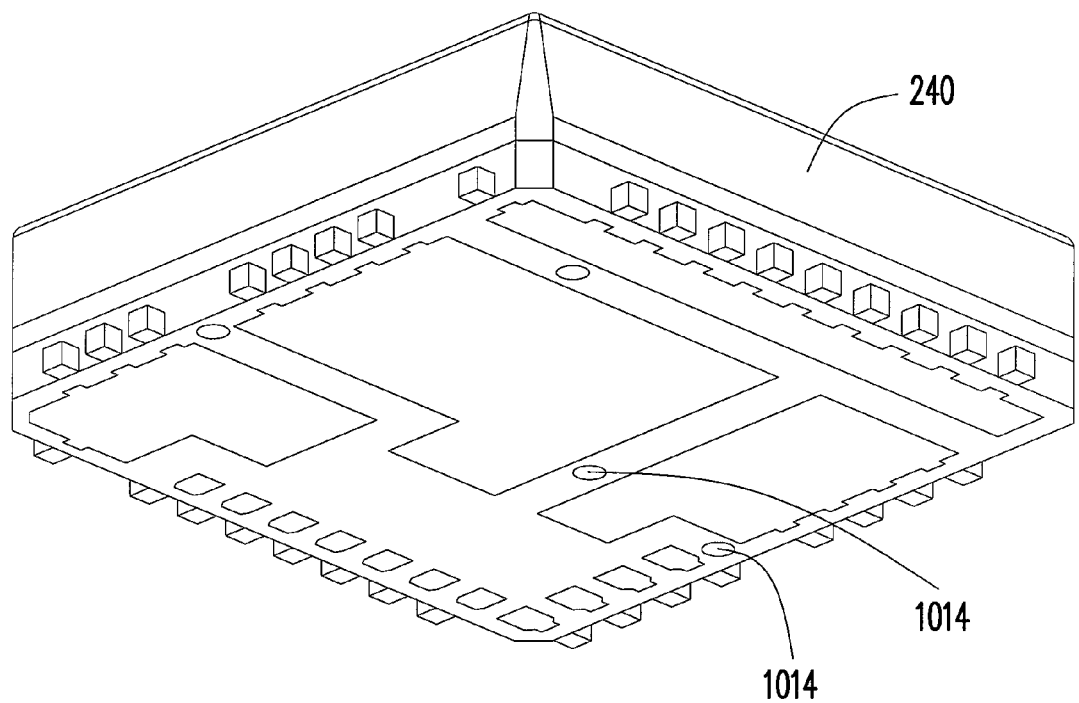
FIG. 11A is a schematic diagram of an electronic element packaging module according to an embodiment of the present invention.
Figure 11B:
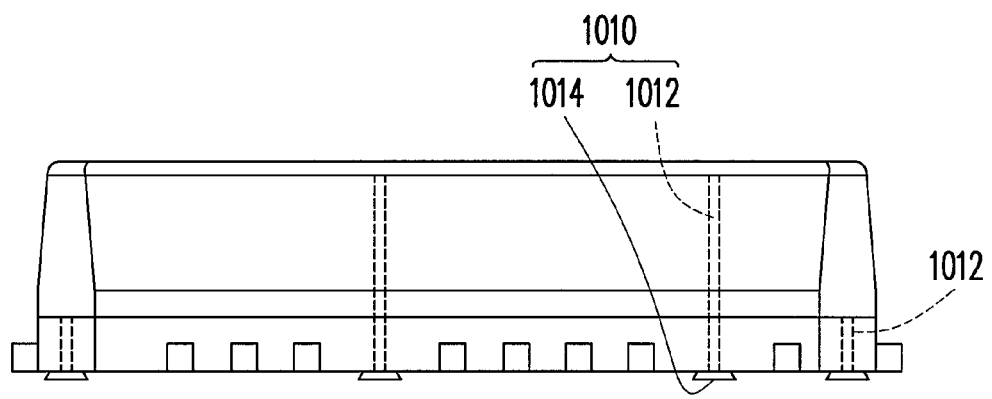
FIG. 11B is a side view of an electronic element packaging module of FIG. 11A.

FIG. 10A is a schematic diagram of an electronic element packaging module according to an embodiment of the present invention. FIG. 10B is a side view of the electronic element packaging module of FIG. 10A. FIG. 11A is a schematic diagram of an electronic element packaging module according to an embodiment of the present invention. FIG. 11B is a side view of the electronic element packaging module of FIG. 11A. Referring to FIG. 10A and FIG. 10B, a plurality of bonding structures 1010 can be configured on the cap 240. The bonding structure 1010 has a pillar 1012 and a stop portion 1014, wherein the pillar 1012 has a first end 1012a and a second end 1012b opposite to the first end 1012a. The first end 1012a is connected to the cap 240, the second end 1012b penetrates through the insulating layer 220 and is connected to the stop portion 1014, and the stop portion 1014 leans against the fourth surface 224 of the insulating layer 220. The bonding structure 1010 is, for example, a tenon (shown in FIG. 10A) or a rivet (shown in FIG. 11A and FIG. 11B).

Figure 12A:
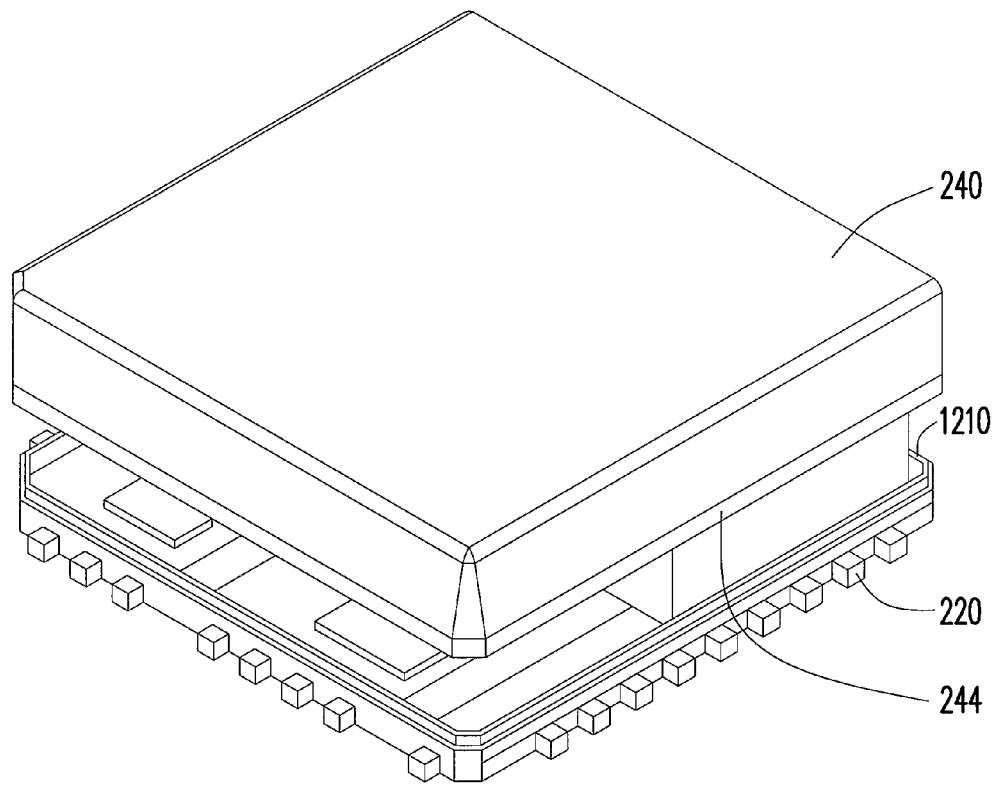
FIG. 12A is an exploded view of an electronic element packaging module according to an embodiment of the present invention.
Figure 12B:
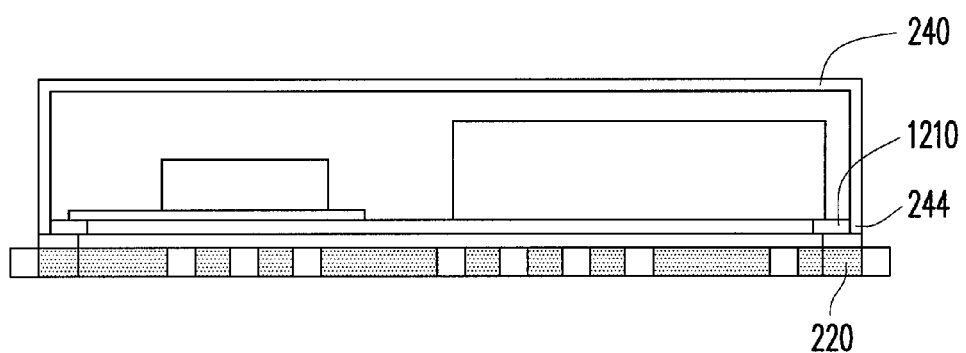
FIG. 12B is a cross-sectional view of an electronic element packaging module of FIG. 12A.

FIG. 12A is an exploded view of an electronic element packaging module according to an embodiment of the present invention. FIG. 12B is a cross-sectional view of the electronic element packaging module of FIG. 12A. Referring to FIG. 12A and FIG. 12B, an engagement frame 1210 is configured on the insulating layer 220, so that the edge 244 of the cap 240 can be interfered with and fitted to the engagement frame 1210.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic element packaging module, comprising:
a lead frame being a patterned metal sheet and having a first surface, a second surface opposite to the first surface and a through trench passing from the first surface to the second surface, a substrate portion and a plurality of lead portions surrounding the substrate portion of the lead frame being defined by the through trench;
an insulating layer, disposed in the through trench, and having a third surface substantially coplanar with the first surface and a forth surface substantially coplanar with the second surface; and
at least one electronic element, at least disposed on the first surface and coupled to the lead frame.

2. The electronic element packaging module as claimed in claim 1, wherein a thermal conductivity coefficient of the insulating layer is greater than or equal to 0.75 W/(m·K).

3. The electronic element packaging module as claimed in claim 1, wherein the through trench divides the substrate portion into a plurality of sub substrate portions mutually separated from each other.

4. The electronic element packaging module as claimed in claim 3, wherein the sub substrate portions are respectively connected to at least a part of the lead portions.

5. The electronic element packaging module as claimed in claim 1, wherein a distance between the first surface and the second surface of the lead frame is substantially less than or equal to 0.5 mm.

6. The electronic element packaging module as claimed in claim 1, wherein the lead frame is a single layer structure.

7. The electronic element packaging module as claimed in claim 1, wherein the lead frame has a plurality of grooves, wherein the grooves are connected to the through trench, and the insulating layer is filled in the grooves.

8. The electronic element packaging module as claimed in claim 7, wherein the grooves are formed on the first surface or the second surface of the lead frame.

9. The electronic element packaging module as claimed in claim 7, wherein a profile of a cross section of the groove is a U-shape, a semicircle, a V-shape, a square, a trapezoid, a mushroom-shape, a ladder-shape, a dovetail notch shape or an irregular shape.

10. The electronic element packaging module as claimed in claim 7, wherein the grooves are respectively located at end parts of the lead portions, and the end parts face to the substrate portion.

11. The electronic element packaging module as claimed in claim 7, wherein the lead frame has a plurality of sidewalls passing from the first surface to the second surface, and the grooves are formed on the sidewalls.

12. The electronic element packaging module as claimed in claim 11, wherein the grooves do not connect the first surface and the second surface.

13. The electronic element packaging module as claimed in claim 11, wherein the grooves connect the first surface and the second surface.

14. The electronic element packaging module as claimed in claim 1, further comprising a cap having a containing concave, wherein the cap is dispose on the first surface, and the lead frame and the insulating layer seals the containing concave to form a containing space, and the electronic element is disposed in the containing space.

15. The electronic element packaging module as claimed in claim 14, wherein a material of the cap comprises metal, resin, gum, plastic or ceramic.

16. The electronic element packaging module as claimed in claim 14, wherein a material of the cap is a conductive material, and the electronic element packaging module further comprises an insulating frame disposed between the lead frame and an edge of the cap.

17. The electronic element packaging module as claimed in claim 14, wherein the lead frame has a plurality of grooves, and a material of the cap is a conductive material, wherein the grooves are formed on edges of the lead portions adjacent to the cap, and the insulating layer is filled in the grooves and is located between the edge of the cap and the lead frame.

18. The electronic element packaging module as claimed in claim 14, further comprising a frame connected between the lead frame and an edge of the cap, wherein an ultrasonic welding interface is formed between the frame and the edge of the cap.

19. The electronic element packaging module as claimed in claim 14, further comprising an adhesion layer connected between the lead frame and an edge of the cap.

20. The electronic element packaging module as claimed in claim 14, further comprising at least one buckle bar disposed outside the containing space, wherein the buckle bar has two end portions and a center portion connecting the two end portions, the two end portions are fixed on the insulating layer, and the center portion extends towards a top surface of the cap facing away from the lead frame, and leans against the top surface.

21. The electronic element packaging module as claimed in claim 14, further comprising a bonding structure having a pillar and a stop portion, wherein the pillar has a first end and a second end opposite to the first end, the first end is connected to the cap, the second end penetrates through the insulating layer and is connected to the stop portion, and the stop portion leans against the fourth surface of the insulating layer.

22. The electronic element packaging module as claimed in claim 14, further comprising an engagement frame disposed on the insulating layer, wherein the engagement frame is interfered with and fitted in the edge of the cap.

23. The electronic element packaging module as claimed in claim 14, further comprising a flexible plastic material filled in the containing space.

24. The electronic element packaging module as claimed in claim 14, wherein a material of the cap is a metal material, and a surface of the electronic element directly contacts an inner surface of the cap.

25. The electronic element packaging module as claimed in claim 1, wherein each of the lead portions has an external end protruding out the insulating layer.

* * * * *